United States Patent [19]

Ando

[11] Patent Number: 5,371,387
[45] Date of Patent: Dec. 6, 1994

[54] FIELD EFFECT TRANSISTORS

[75] Inventor: Yuji Ando, Tokyo, Japan

[73] Assignee: NEC Corporation, Tokyo, Japan

[21] Appl. No.: 176,513

[22] Filed: Jan. 3, 1994

Related U.S. Application Data

[63] Continuation of Ser. No. 782,625, Oct. 25, 1991, abandoned.

[30] Foreign Application Priority Data

Oct. 25, 1990 [JP] Japan ......................... 2-288811

[51] Int. Cl.$^5$ ..................... H01L 33/00; H01L 23/10
[52] U.S. Cl. ..................... 257/192; 257/194; 257/280
[58] Field of Search ............... 357/22, 16; 257/280, 257/284, 192, 194

[56] References Cited

U.S. PATENT DOCUMENTS

| 4,740,822 | 4/1988 | Itoh | 357/23.1 |
| 4,748,484 | 5/1988 | Takakuwa et al. | 357/22 |
| 5,032,893 | 7/1991 | Fitzgerald | 257/422 |

FOREIGN PATENT DOCUMENTS

| 57-068073 | 4/1982 | Japan | 357/22 |
| 61-174676 | 8/1986 | Japan | 357/22 |
| 62-035677 | 2/1987 | Japan | 357/22 |
| 62-035678 | 2/1987 | Japan | 357/22 |
| 62-42462 | 2/1987 | Japan | 357/22 |
| 63-102270 | 5/1988 | Japan | 357/22 |

OTHER PUBLICATIONS

Microwave Performance of a Quarter–Micrometer Gate Low–Noise Pseudomorphic InGaAs/AlGa/As Modulation–Doped Field Effect Transistor, IEEE Electron Device Letters, vol. EDL–7, No. 12, Dec. 1986, pp. 649–651, by T. Henderson, et al.

Electron Energy Levels in GaAs–Ga$_{1-x}$Al$_x$As Heterojunctions, Physical Review B, vol. 30, No. 2, pp. 840–848, by Frank Stern, et al. (Jul., 1984).

Primary Examiner—Andrew J. James
Assistant Examiner—Stephen D. Meier
Attorney, Agent, or Firm—Burns, Doane, Swecker & Mathis

[57] ABSTRACT

A field effect transistor includes a buffer layer, an undoped channel layer, and a N-type electron supplying layer which are sequentially deposited on a semi-insulating semiconductor substrate. The undoped channel layer is formed of an In$_x$Ga$_{1-x}$As layer. The In composition ratio in the InGaAs layer varies gradually in the direction of the thickness and has a maximum value at the position spaced away from the interface of the N-type electron supplying layer of the InGaAs layer by 40 Å or more but less than 110 Å.

3 Claims, 6 Drawing Sheets

FIELD EFFECT TRANSISTORS

This application is a continuation of application Ser. No. 07/782,625, filed Oct. 25, 1991 now abandoned.

BACKGROUND OF THE INVENTION

1. Field of the Invention

The present invention relates to a 2-dimensional electron gas field effect transistor (2DEGFET).

2. Brief Description of the Related Art

2DEGFET devices, for example, were reported in the IEEE Electron Device Letters, Vol. EDL-7, No. 12 (1986), p. 649, by Henderson.

Figure 1:
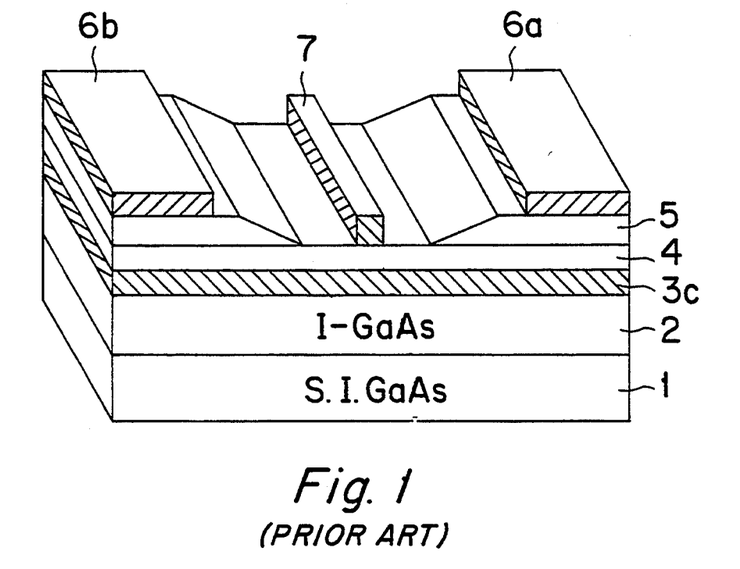
FIG. 1 is a cross sectional view showing a prior art 2DEGFET.
Figure 2A:
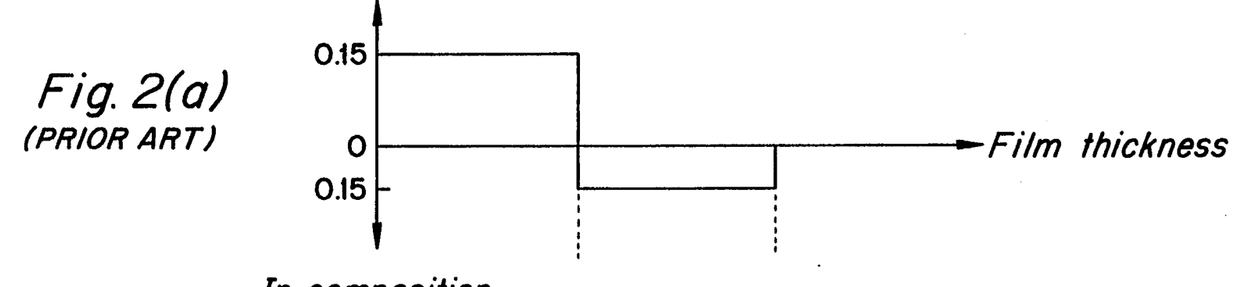
Figure 2B:
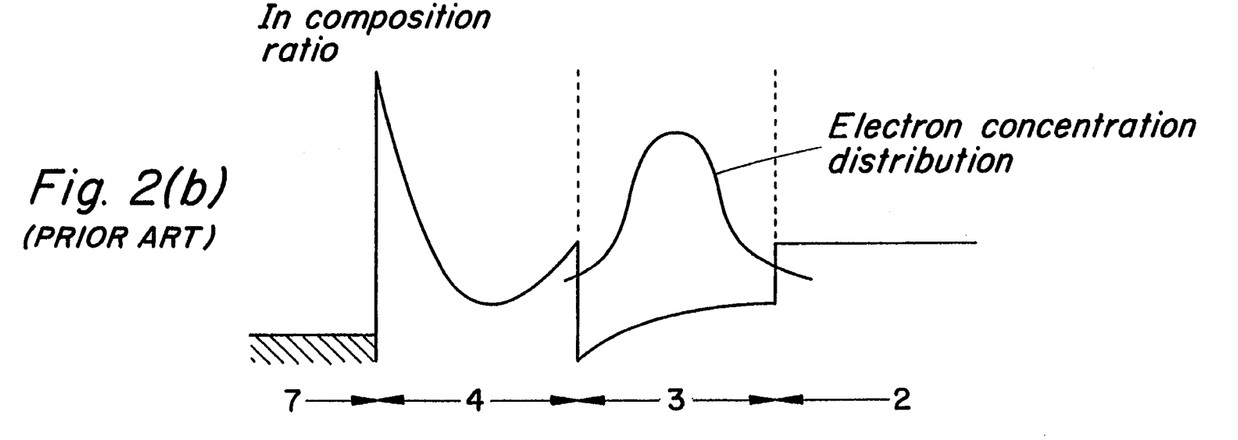

A prior art 2DEGFET device will be explained with reference to FIG. 1 showing a partial cross-sectional view, FIG. 2(a) showing a distribution diagram of the Al composition ratio and the In composition ratio in the direction from an N-type AlGaAs layer to an undoped GaAs buffer layer, and FIG. 2(b) showing a potential band diagram.

In the 2DEGFET device, an undoped GaAs layer 2 acting as a buffer layer, an undoped $In_{0.15}Ga_{0.85}As$ channel layer 3c, and an N-type $Al_{0.15}Ga_{0.85}As$ layer 4 acting as a carrier supplying layer are formed on a semi-insulating GaAs substrate.

Two-dimensional electron gas (2DEG) is induced near by the interface between the AlGaAs layer 4 and an InGaAs layer 3c to form a channel. A cap layer 5 of N-type GaAs is formed on the AlGaAs layer 4. The source electrode 6a and drain electrode 6b are formed on the cap layer 5 through a vapor deposition process to obtain ohmic contacts to the 2DEG channel layer. The gate electrode 7 is formed in a recess portion which is formed by etching the cap layer 5.

The effect to be expected from InGaAs used for the channel layer is that an increased conduction band offset between the AlGaAs electron supplying layer and the channel layer results in an increased sheet electron concentration while a decreased electron effective mass results in increased electron mobility.

InGaAs and GaAs have a different lattice constant from each other. It has been well-known that a good interface can be formed by making the $In_xGa_{1-x}As$ channel layer to less than the critical film thickness which causes a misfit dislocation whereby the elastic strain is converted into a strain lattice layer which can relax lattice unconformity.

Since an increasing In composition ratio increases the lattice unconformity, the critical film thickness decreases.

In case the film thickness is thinned to suppress misfit dislocation generated with an increased In composition ratio, the sub-band energy within the quantum well increases inversely proportional to the second power of film thickness. As a result, a fall of electron concentration as well as a fall of carrier enclosure within an InGaAs well occur, thus eliminating the merit obtained by using InGaAs as a channel.

That is, the more the In composition in the InGaAs strain layer is increased to improve the sheet electron concentration and electron mobility, the more the lattice dislocation increases, falling into a dilemma in that restriction on the thickness of the channel layer becomes rigid because of the critical film thickness.

For that reason, usually an InGaAs channel layer with an In composition ratio of 0.15 and with a thickness of about 150 Å being less than the critical film thickness has been used in the 2DEGFET, resulting however in a problem that increase of sheet electron concentration and improved electron transfer characteristics by increasing In composition ratio cannot be sufficiently exhibited.

SUMMARY OF THE INVENTION

An object of the present invention is to provide an epitaxial structure which is capable of increasing effectively the In composition by suppressing a drop in the critical film thickness occurred with an increase in lattice unconformity of an epitaxial layer structure of a 2DEGFET.

Another object of the present invention is to provide a field effect transistor which includes an epitaxial layer structure having an effectively increased In composition.

According to the present invention, a field effect transistor has a buffer layer, an undoped channel layer, and an N-type impurity doped electron supplying layer which are laminated sequentially.

The undoped channel layer comprises an $In_xGa_{1-x}As$ layer. The In composition ratio x of the InGaAs layer varies gradually in the direction of the thickness thereof and is maximized at a position spaced away by 40 Å or more but less than 110 Å from the interface between the N-type electron supplying layer and the InGaAs layer.

The undoped channel layer is a superlattice layer which is formed by alternately laminating an InAs layer of m-molecular layers and a GaAs layer of n-molecular layers. In the superlattice layer, the molecular layer number ratio m/n of InAs layer and GaAs layer varies gradually in the direction of the thickness and is maximized at a position of 40 Å or more but less than 110 Å spaced away from the interface between the electron supplying layer and the superlattice layer.

The undoped channel layer also is a superlattice layer in which a first semiconductor layer and a second semiconductor layer is alternately laminated. The first semiconductor layer is formed of an $In_xGa_{1-x}As$ layer. The In composition ratio x is generally varied in the direction of the thickness thereof and is maximized at a position of 40 Å or more but less than 110 Å spaced away from the interface between the superlattice layer and the electron supplying layer.

F. Stern and S. D. Sarma reported in the Physical Review B, Vol. 30 (1984), pp. 840–848, that a 2DEGFET structure has a peak of two-dimensional electron distribution probability at a distance of about 60 to 90 Å spaced away from the hetero-interface between the electron supplying layer and the channel layer.

According to the present invention, the In composition ratio x of the $In_xGa_{1-x}As$ channel layer is graded in the direction of the film thickness thereof. The composition ratio x is maximized near by the position where the electron distribution probability becomes maximum while it is made small near by the electron supplying layer interface and the buffer layer interface.

As a whole, with suppression of an increase of the lattice unconformity the In composition ratio x at the position where the electron presence probability is high can be increased, whereby the value x at the place where electrons run effectively can be made larger than the upper limit (~0.15) used conventionally.

A similar effect may be expected by using as a channel, a short periodic superlattice which comprises a laminated structure of an InAs layer of m molecular layers and a GaAs layer of n molecular layers, the ratio m/n of InAs layer and GaAs layer being graded in the direction of the thickness thereof, and the ratio m/n being maximized at the position where the electron distribution is maximum while it is made small near by the electron supplying layer interface and the buffer layer interface.

Normally, electrons in an InGaAs mixed crystal are subjected to scattering (alloy scattering) due to the disordered location of In atoms and Ga atoms. However, in this way, when a short periodic superlattice with a crystal structure controlled in the direction of the thickness is used as a channel, it decreases the alloy scattering, so that the electron transfer characteristics can be further improved.

Furthermore, similar effect can be expected when a superlattice which is formed by laminating alternately a first semiconductor layer and a second semiconductor layer is used, the first semiconductor layer being an InxGa1-xAs in which the In composition ratio x is graded in the direction of the thickness thereof, and the value x is maximized near by the position where the electron distribution probability is maximized while it is made small near by the electron supplying layer interface and the buffer layer interface at the position where the electron distribution probability becomes small. In this case, the second semiconductor layer may be an InGaAs which has a distribution of composition ratio different from the second semiconductor layer.

BRIEF DESCRIPTION OF THE DRAWINGS

These and other features and advantages of the invention may be more completely understood from the following detailed description of the preferred embodiments of the invention with reference to the accompanying drawings in which:

FIG. 2($a$) is a distribution diagram showing composition ratios of FIG. 1;

FIG. 2($b$) is a potential band diagram of FIG. 1;

FIG. 4($a$) is a distribution diagram showing composition ratios of FIG. 3;

FIG. 4($b$) is a potential band of FIG. 3;

FIG. 6($a$) is a distribution diagram showing composition ratios of FIG. 5;

FIG. 6($b$) is a potential band diagram of FIG. 5;

FIG. 8($a$) is a distribution diagram showing composition ratios of FIG. 7; and

FIG. 8($b$) is a potential band diagram for FIG. 7.

DESCRIPTION OF THE PREFERRED EMBODIMENTS

Figure 3:
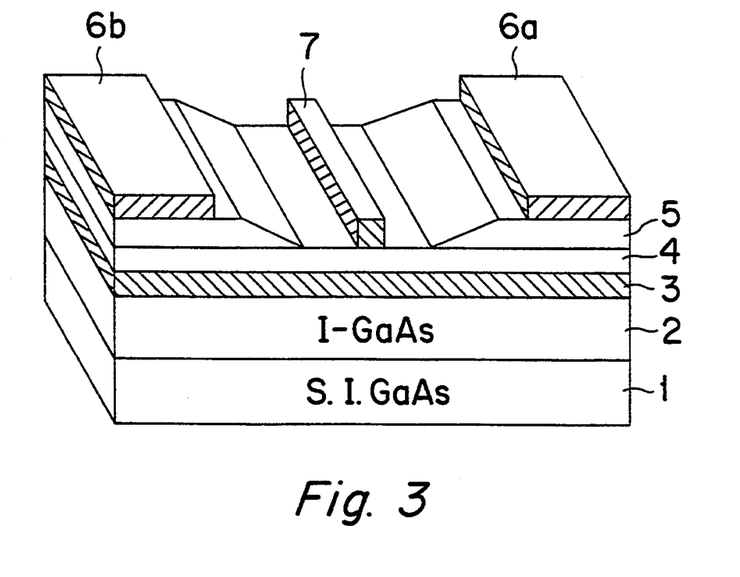
FIG. 3 is a partial cross-sectional view showing a first embodiment according to the present invention.

A first embodiment according to the present invention will be explained with reference to FIG. 3 showing a partial cross-sectional view, FIG. 4($a$) showing the distribution diagram of the Al composition ratio and the In composition ratio at a cross sectional view taken along from the N-type $Al_yGa_{1-y}As$ (y=0.15) layer 4 to the undoped GaAs buffer layer 2, and FIG. 4($b$) showing a potential band diagram.

Figure 4A:
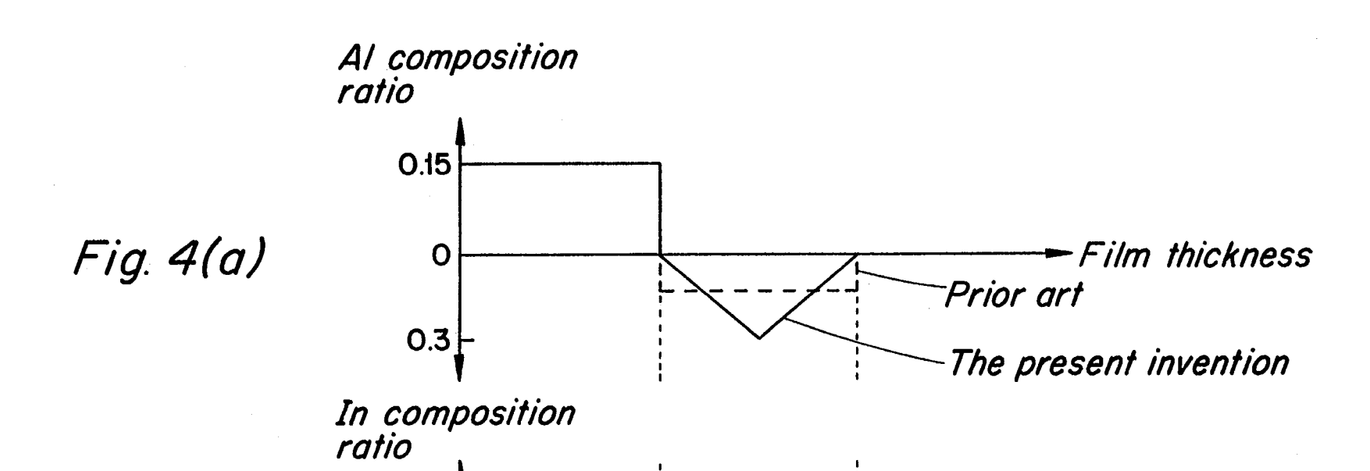

As shown in FIG. 4($a$), the present invention is characterized in that the In composition ratio x of the channel layer 3 increases gradually from 0 to the maximum value of 0.3 toward the interface at the AlGaAs layer 4 from the interface at the GaAs buffer layer 2, and then decreases gradually to zero. In this case, the composition ratio x has a maximum value of 0.3 at the position spaced away from AlGaAs layer interface by 80 Å.

The structure shown in FIG. 3 is produced in accordance with the following steps.

First, using a molecular beam epitaxial (MBA) growth method, on a semi-insulating (S.I.) GaAs substrate 1 are sequentially formed an undoped GaAs buffer layer 2 of 1 μm thickness, an undoped $In_xGa_{1-x}As$ graded layer (x=0→0.3→0) 3 of 160 Å thickness, an N-type $Al0.15Ga0.85As$ 4 (with a doping concentration of $3 \times 10^{18}/cm^3$) of 350 Å thickness, and a N-type GaAs layer 5 (with a doping concentration of $5 \times 10^{18}/cm^3$) of 500 Å thickness.

Here, the InGaAs channel layer 3 has an average In composition ratio of 0.15 and the total film thickness of 160 Å which is less than the critical film thickness (~200 Å) which causes a misfit dislocation in the $In_{0.15}Ga_{0.85}As$.

The source electrode 6$a$ and the drain electrode 6$b$ are formed on the N-type GaAs cap layer by vapor deposition, and an ohmic contact is made thereafter, through an alloy thermal process.

The gate electrode 7 is formed in a recessed portion formed by removing the N-type GaAs layer 5 through an etching process.

Figure 4B:
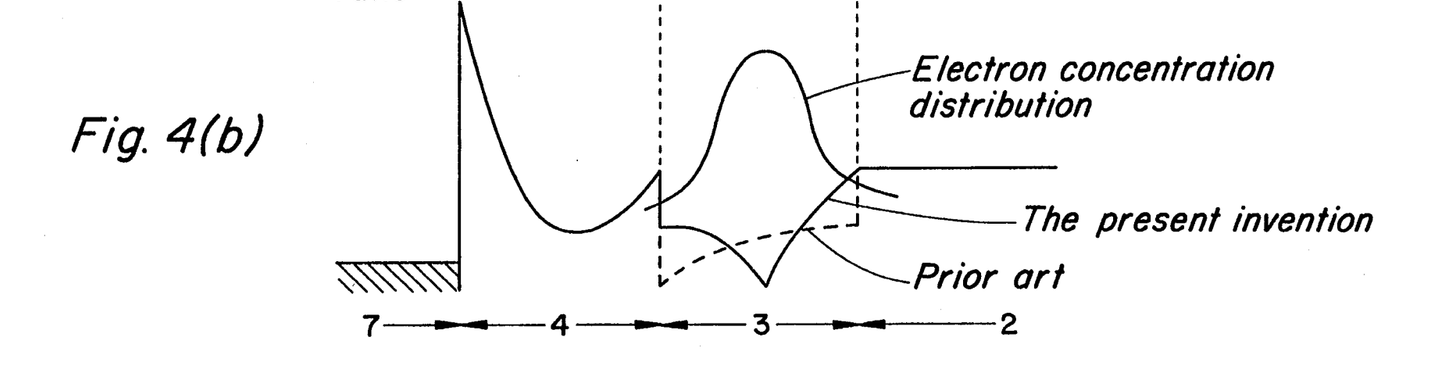

Then, as shown in FIG. 4($b$), the distribution probability of the 2DEG becomes a maximum value approximately at the middle portion of the InGaAs quantum well layer. As seen from FIG. 4($a$), the maximum position coincides with the place where the In composition ratio takes a maximum value of 0.3, whereby the electrons run through the place where the composition ratio is larger than 0.15 with higher probability.

In the present invention, with the In average composition ratio fixed at 0.15, the effective In composition ratio can be increased further.

Figure 5:
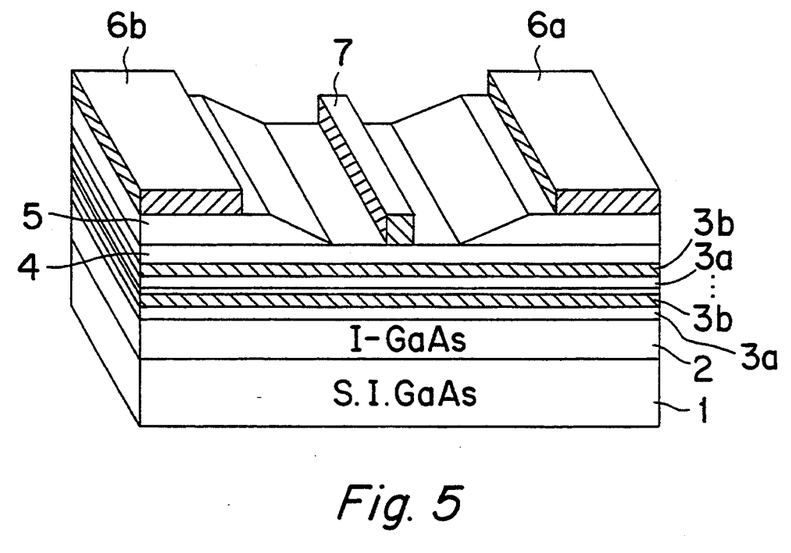
FIG. 5 is a partial cross-sectional view showing a second embodiment according to the present invention.

A second embodiment according to the present invention will be explained with reference to FIG. 5 showing a partial cross-sectional view, FIG. 6($a$) showing an Al composition ratio and In composition ratio distribution diagram at the cross section taken along from the N-type $Al_rGa_{1-r}As$ (r=0.15) electron supplying layer 4 to the undoped GaAs buffer layer 2, and FIG. 6($b$) showing a potential band diagram.

Figure 6A:
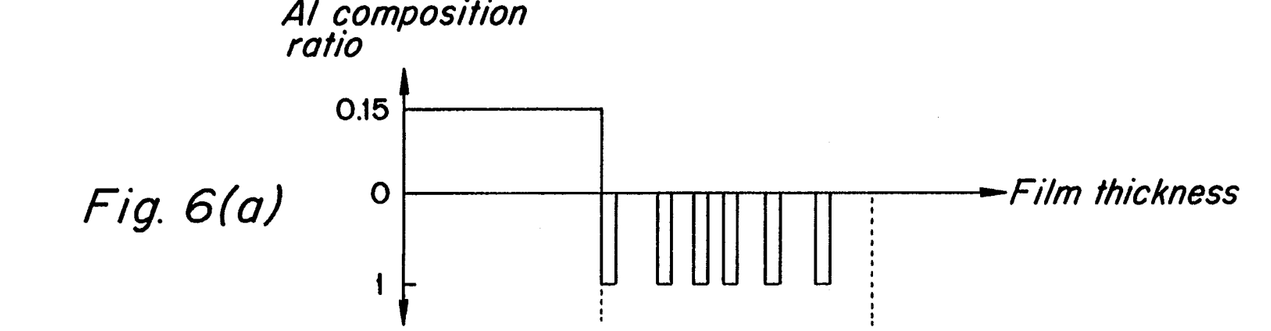

A feature of the present embodiment, as shown in FIG. 6($a$), is to use as a channel a short periodic superlattice layer formed of a laminated structure of an InAs layer of m molecular layers and a GaAs layer of n molecular layers. The ratio m/n of the InAs layer and the GaAs layer is graded in the direction of the thickness. The ratio m/n is increased gradually to a maximum value toward the interface of the AlGaAs layer 4 from the interface of the GaAs buffer layer 2, and then is decreased gradually to zero. In this case, the maximum value of m/n appears at the place spaced away by about 70 Å from the AlGaAs layer interface.

The structure seen in FIG. 5 is produced as follows:

First, using a MBE growth method, on a S.I. GaAs substrate 1 are sequentially deposited an undoped GaAs layer 2 of 1 μm, a GaAs layer 3$a$ of 10 molecular layers, an InAs layer 3$b$ of a single molecular layer, a GaAs layer 3$a$ of 6 molecular layers, an InAs layer 3$b$ of a single molecular layer, a GaAs layer 3$a$ of 3 molecular layers, an InAs layer 3$b$ of a single molecular layer, a GaAs layer 3a of two molecular layers, a InAs layer 3b of a single molecular layer, a GaAs layer 3a of 2 molecular layers, an InAs layer 3b of a single molecular layer, a GaAs layer 3a of 3 molecular layers, an InAs layer 3b of a single molecular layer, a GaAs layer 3a of 6 molecular layers, an InAs layer 3b of a single molecular layer, a GaAs layer 3a of 10 molecular layers, an InAs layer 3b of a single molecular layer (Total thickness of the InAs/GaAs superlattice channel layer: 140 Å), an electron supplying layer 4 of an N-type $Al_{0.15}Ga_{0.85}As$ (with a doping concentration of $3\times 10^{18}/cm^3$) of 350 Å thickness, and a cap layer 5 of an N-type GaAs (with a doping concentration of $5\times 10^{18}/cm^3$) of 500 Å thickness.

In the superlattice channel layer, the average In composition ratio is 0.16 and the total film thickness of 140 Å is less than the critical film thickness ($\sim 200$ Å) at which a misfit dislocation may occur in the $In_{0.16}Ga_{0.84}As$.

The source electrode 6a and the drain electrode 6b are formed on the N-type GaAs cap layer 5 by vapor deposition and an alloy process is performed thereafter, to obtain ohmic contacts.

The gate electrode 7 is formed in a recess portion formed by removing the N-type GaAs cap layer 5 through an etching process.

Figure 6B:
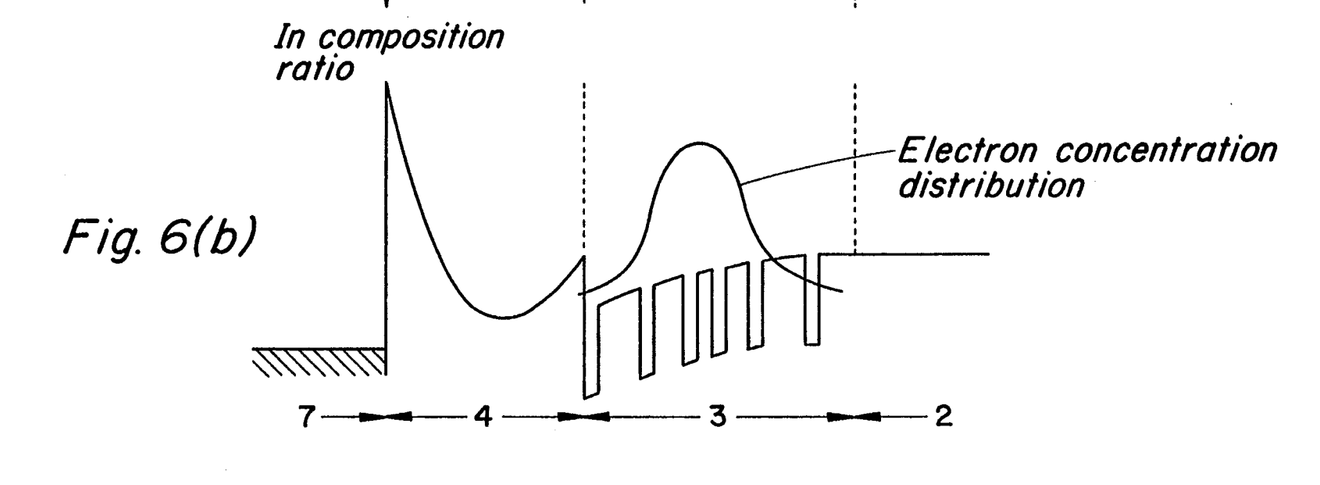

As shown in FIG. 6(b), the distribution probability of 2DEG takes a maximum value approximately at the middle portion of the InAs/GaAs superlattice layer.

From FIG. 6(a), this position coincides with a place where the molecular layer number ratio m/n in (InAs)m(GaAs)n takes a maximum value, whereby electrons run through the place with In composition ratio larger than 0.15 with higher probability. As described above, according to the present invention, with an In average composition ratio fixed at about 0.15, an effective In composition ratio can be increased further.

Figure 7:
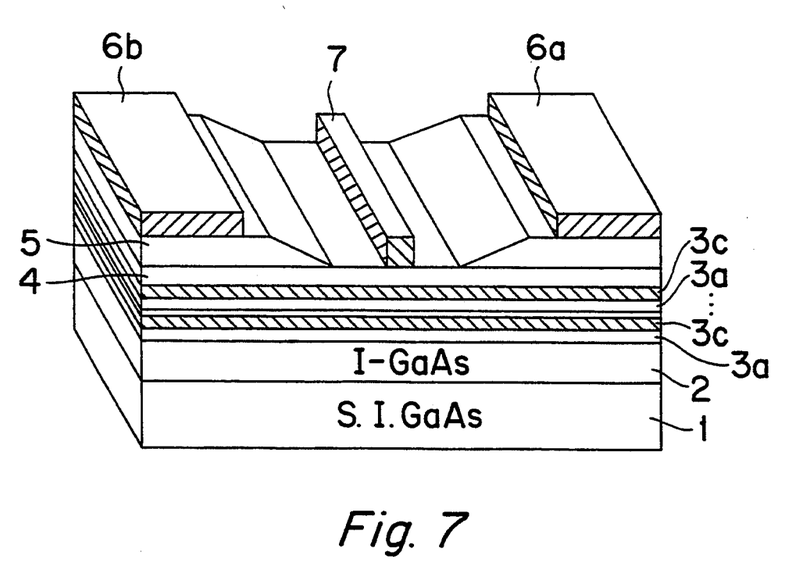
FIG. 7 is a partial cross-sectional view shown in a third embodiment according to the present invention.
Figure 8A:
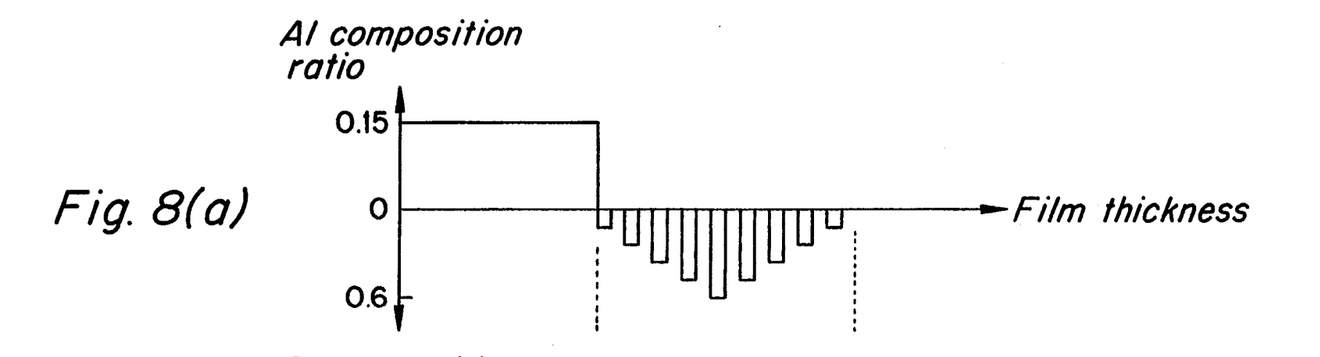
Figure 8B:
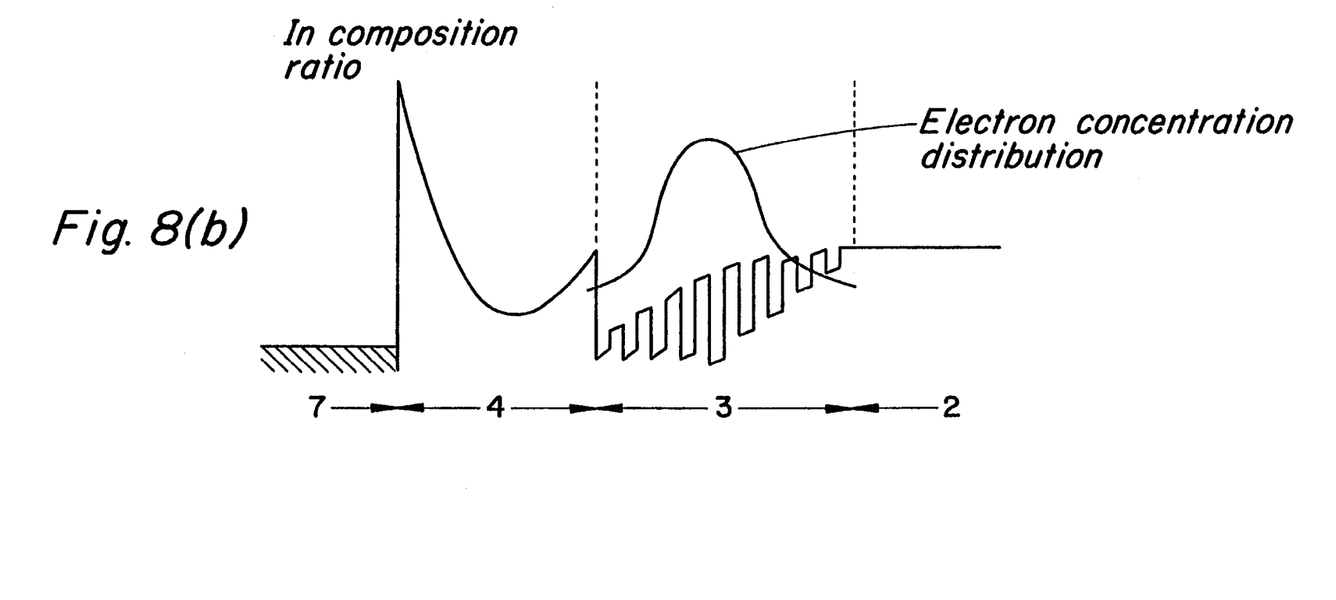

A third embodiment according to the present invention will be explained with reference to FIG. 7 showing a partial cross-sectional view, FIG. 8(a) showing a diagram of the Al composition ratio and the In composition ratio distribution in the cross section taken along from the N-type $Al_yGa_{1-y}As$ (y=0.15) electron supplying layer 4 toward the undoped GaAs buffer layer 2, and FIG. 8(b) showing a potential band diagram.

A feature of the present embodiment, as shown in FIG. 8(a) is to use, a short periodic superlattice which is formed of a laminated structure of an InGaAs single molecular layer and a GaAs single molecular layer as a channel. The In composition ratio x in the $In_xGa_{1-x}As$ layer is graded in the direction of the film thickness. The composition x increases gradually toward the interface of the AlGaAs layer 4 from the interface of the GaAs buffer layer 2 and then decreases gradually to zero. The maximum value of m/n is at the position spaced away from the AlGaAs layer interface by about 70 Å.

The structure shown in FIG. 7 is produced as follows;

First, by using a MBE growth method, on a S.I. GaAs substrate 1 are formed an undoped GaAs buffer layer 2 of 1 μm thickness, a first GaAs layer 3a of a single molecular layer, a first InGaAs layer (x=0.05) 3c of a single molecular layer, a second GaAs layer 3a of a single molecular layer, a second InGaAs (x=0.1) 3c of a single molecular layer, an i-th GaAs layer 3a of a single molecular layer, an i-th InGaAs layer (x=0.05 x i) 3c of a single molecular layer, a 12-th GaAs layer 3a of a single molecular layer, a 12-th InGaAs (x=0.6) layer 3c of a single molecular layer, a 13-th GaAs layer 3a of a single molecular layer, a 13-th InGaAs (x=0.6) layer 3c of a single molecular layer, a j-th GaAs layer 3a of a single molecular layer, a j-th InGaAs (x=0.05 x (25-j)) layer 3c of a single molecular layer, a 23-th GaAs layer 3a of a single molecular layer, a 23-th InGaAs layer (x=0.1) layer 3c of a single molecular layer, a 24-th GaAs layer 3a of a single molecular layer, a 24-th InGaAs (x=0.05) layer 3c of a single molecular layer (Total thickness of InGaAs/GaAs superlattice layer: about 140 Å), an electron supplying layer 4 of an N-type $Al_{0.15}Ga_{0.85}As$ (with a doping concentration of $3\times 10^{18}/cm^3$) of 350 Å thickness, and an N-type GaAs cap layer (with a doping concentration of $5\times 10^{18}cm^3$) of 500 Å thickness.

Here, the average In composition ratio in the superlattice channel layer is 0.16 and the total film thickness of 140 Å is less than the critical film thickness ($\sim 200$ Å) which causes a misfit dislocation in the $In_{0.16}Ga_{0.84}As$.

The source electrode 6a and the drain electrode 6b are formed on the N-type GaAs cap layer 5 through vapor deposition and then ohmic contacts are formed thereafter by an alloy process.

The gate electrode 7 is formed in the recess portion which is formed by removing the N-type GaAs layer 5 through an etching process.

As shown in FIG. 8(b), the distribution probability of 2DEG takes a maximum value approximately at the middle portion of the InGaAs-GaAs superlattice layer.

From FIG. 6(a), this position coincides with the place where the In composition ratio in the $In_xGa_{1-x}As$ takes a maximum value, whereby electrons run through the place with a value larger than the In composition ratio of 0.15.

According to the present embodiment, while maintaining the average In composition ratio at about 0.15, the effective In composition ratio can be further increased.

Although AlGaAs/InGaAs series, AlGaAs/(InAs)$_m$-(GaAs)$_n$ superlattice series, and AlGaAs/(InGaAs)$_m$-(GaAs)$_n$ superlattice series have been used above, InAlAs/InGaAs series, InP/InGaAs series, InAlAs/-(InAs)$_m$(GaAs)$_n$ superlattice series, InP/(InAs)$_m$-(GaAs)$_n$ superlattice series, InAlAs/(In$_x$Ga$_{1-x}$As)-$_m$(In$_{0.53}$Ga$_{0.47}$As)$_n$ superlattice series, InP/(In$_x$Ga$_{1-x}$As)$_m$(In$_{0.53}$Ga$_{0.47}$As)$_n$ superlattice series, InAlAs/(In$_x$-Ga$_{1-x}$As)$_m$(In$_{0.52}$Al$_{0.48}$As)$_n$ superlattice series, InP/(In$_x$-Ga$_{1-x}$As)$_m$(In$_{0.52}$Al$_{0.48}$As)$_n$ superlattice series or the like, and a superlattice including InGaAs, (InAs)$_m$-(GaAs)$_n$ superlattice, or InGaAs layer can be used as a channel.

As described above, according to the present invention, while suppressing an increase of lattice dislocation in the InGaAs channel as far as possible it became possible to make the effective In composition ratio larger than the conventional upper limit (for instance, $\sim 0.15$).

The electron transfer characteristics improved due to the reduced electron effective mass can realize better characteristics of the InGaAs channel 2 DEGFET device.

What is claimed is:

1. A field effect transistor, comprising:
   a buffer layer;
   an undoped channel layer; and
   an N-type electron supplying layer which are sequentially deposited on a semi-insulating semiconductor substrate, said undoped channel layer being an $In_xGa_{1-x}As$ layer, with the In composition ratio in said $In_xGa_{1-x}As$ layer varying gradually in the direction of the thickness and having a maximum value at the position spaced away from the interface of said N-type electron supplying layer and said $In_xGa_{1-x}As$ layer by 40 Å or more but less than 110 Å and the total film thickness of the undoped channel layer is less than a critical film thickness which causes a misfit dislocation of $In_yGa_{1-y}As$ in the undoped channel layer, y being an average In composition ratio.

2. A field effect transistor, comprising:
a buffer layer;
an undoped channel layer; and
an N-type electron supplying layer which are sequentially deposited on a semi-insulating semiconductor substrate,
wherein said undoped channel layer comprises a superlattice which is laminated alternately with an InAs layer of m molecular layers and a GaAs layer of n molecular layers,
wherein the molecular layer number ratio m/n of said InAs layer and said GaAs layer varies gradually in the direction of the thickness and has a maximum value at the position spaced away from the interface of said N-type electron supplying layer and said superlattice by 40 Å or more but less than 110 Å, and
wherein the total film thickness of the undoped channel layer is less than a critical film thickness which causes a misfit dislocation of $In_yGa_{1-y}As$ in the undoped channel layer, y being an average In composition ratio.

3. A field effect transistor, comprising:
a buffer layer;
an undoped channel layer; and
an N-type electron supplying layer which are sequentially deposited on a semi-insulating semiconductor substrate,
wherein said undoped channel layer comprises a superlattice laminated alternately with a first semiconductor layer and a second semiconductor layer, said first semiconductor layer being an $In_xGa_{1-x}As$ layer,
wherein the In composition ratio in said $In_xGa_{1-x}As$ layer varies gradually in the direction of the thickness and has a maximum value at the position spaced away from the interface of said N-type electron supplying layer and the superlattice layer by 40 Å or more but less than 110 Å, and
wherein the total film thickness of the undoped channel layer is less than a critical film thickness which causes a misfit dislocation of $In_yGa_{1-y}As$ in the undoped channel layer, y being an average In composition ratio.

* * * * *